United States Patent
Su et al.

(10) Patent No.: US 8,890,217 B2
(45) Date of Patent: Nov. 18, 2014

(54) ELECTRONIC DEVICE

(71) Applicants: Po-Jen Su, Tainan (TW); Yun-Li Li, Tainan (TW); Cheng-Yen Chen, Tainan (TW); Gwo-Jiun Sheu, Tainan (TW)

(72) Inventors: Po-Jen Su, Tainan (TW); Yun-Li Li, Tainan (TW); Cheng-Yen Chen, Tainan (TW); Gwo-Jiun Sheu, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/670,418

(22) Filed: Nov. 6, 2012

(65) Prior Publication Data
US 2013/0146913 A1    Jun. 13, 2013

(30) Foreign Application Priority Data
Dec. 8, 2011   (TW) .............................. 100145327 A

(51) Int. Cl.
*H01L 23/48* (2006.01)
(52) U.S. Cl.
USPC ............. 257/276; 257/98; 257/625; 257/675; 257/706; 257/717

(58) Field of Classification Search
CPC ......... H01L 23/34; H01L 23/36; H01L 23/40; H01L 23/345; H01L 23/49568; H01L 33/60
USPC .................... 257/98, 276, 625, 675, 706, 717
See application file for complete search history.

(56) References Cited

U.S. PATENT DOCUMENTS

| | | | |
|---|---|---|---|
| 7,470,987 B2 * | 12/2008 | Tsuchiya et al. | 257/753 |
| 2005/0168992 A1 * | 8/2005 | Hirose | 362/296 |
| 2006/0208364 A1 * | 9/2006 | Wang et al. | 257/778 |
| 2011/0101399 A1 * | 5/2011 | Suehiro et al. | 257/98 |
| 2011/0114989 A1 * | 5/2011 | Suehiro et al. | 257/99 |
| 2011/0297914 A1 * | 12/2011 | Zheng et al. | 257/13 |

* cited by examiner

*Primary Examiner* — Tan N Tran
(74) *Attorney, Agent, or Firm* — Jianq Chyun IP Office

(57) ABSTRACT

An electronic device including an insulating substrate, a chip and a patterned conductive layer is provided. The insulating substrate has an upper surface and a lower surface opposite to each other. The chip is disposed above the upper surface of the insulating substrate. The patterned conductive layer is disposed between the upper surface of the insulating substrate and the chip. The chip is electrically connected to an external circuit via the patterned conductive layer. Heat generated by the chip is transferred to external surroundings via the patterned conductive layer and the insulating substrate.

12 Claims, 5 Drawing Sheets

ELECTRONIC DEVICE

CROSS-REFERENCE TO RELATED APPLICATION

This application claims the priority benefit of Taiwan application serial no. 100145327, filed on Dec. 8, 2011. The entirety of the above-mentioned patent application is hereby incorporated by reference herein and made a part of this specification.

BACKGROUND OF THE INVENTION

1. Field of the Invention

The invention relates to an electronic device, and more particularly to an electronic device having an electro-thermal separation characteristic.

2. Description of Related Art

With the development of the fabrication techniques, light emitting efficiency and luminance of the light emitting diodes (LEDs) are gradually improved, thereby complying with the requirements for all kinds of products and expanding applications of the LEDs. In other words, in order to increase the brightness of the LEDs, external package problems of the LEDs should be solved, and a design of the LEDs with high power and high working current is required as well, so as to manufacture the LEDs featuring satisfactory luminance. However, under the circumstance of increasing the power and the working current, the LEDs generate more heat, so the performance thereof is apt to be compromised by overheat; what is worse, overheat even causes malfunction of the LEDs. Accordingly, how to enhance both the light emitting efficiency and heat dissipation capability of the LEDs has become a major area of research.

SUMMARY OF THE INVENTION

The invention provides an electronic device having an electro-thermal separation characteristic.

The invention provides an electronic device including an insulating substrate, a chip, and a patterned conductive layer. The insulating substrate has an upper surface and a lower surface opposite to each other. The chip is disposed above the upper surface of the insulating substrate. The patterned conductive layer is disposed between the upper surface of the insulating substrate and the chip, in which the chip is electrically connected to an external circuit via the patterned conductive layer, and heat generated by the chip is transferred to external surroundings via the patterned conductive layer and the insulating substrate.

According to an embodiment of the invention, the chip includes a chip substrate, a semiconductor layer, and a plurality of conductive contacts. The semiconductor layer is located between the chip substrate and the conductive contacts, and the conductive contacts are connected to the patterned conductive layer.

According to an embodiment of the invention, a specific heat of the insulating substrate is higher than 650 J/Kg-K.

According to an embodiment of the invention, a coefficient of thermal conductivity of the insulating substrate is greater than 10 W/m-K.

According to an embodiment of the invention, a thickness of the insulating substrate is lower than or equal to a thickness of the chip substrate.

According to an embodiment of the invention, the thickness of the insulating substrate is 0.6 to 1 times the thickness of the chip substrate.

According to an embodiment of the invention, a specific surface area of the insulating substrate is greater than a specific surface area of the chip substrate.

According to an embodiment of the invention, the specific surface area of the insulating substrate is greater than 1.1 times the specific surface area of the chip substrate.

According to an embodiment of the invention, the insulating substrate is a transparent insulating substrate.

According to an embodiment of the invention, the chip further includes a reflective layer disposed between the semiconductor layer and the conductive contacts.

According to an embodiment of the invention, the electronic device further includes at least a conductive connecting structure connected between the patterned conductive layer and the external circuit. The chip is electrically connected to the external circuit via the patterned conductive layer and the conductive connecting structures.

According to an embodiment of the invention, the external circuit includes a lead frame, a circuit substrate, or a printed circuit board.

According to an embodiment of the invention, the electronic device further includes at least a heat dissipation device embedded in the lower surface of the insulating substrate.

According to an embodiment of the invention, the electronic device further includes an insulating layer and a plurality of heat dissipation channels. The insulating layer is disposed between the patterned conductive layer and the insulating substrate. The heat dissipation channels pass through an upper surface and a lower surface of the insulating substrate. A top surface of each of the heat dissipation channels is connected to the insulating layer. Moreover, a bottom surface of each of the heat dissipation channels and the lower surface of the insulating substrate are coplanar.

According to an embodiment of the invention, the insulating substrate further includes at least a blind hole disposed on the lower surface.

According to an embodiment of the invention, the patterned conductive layer is located on the upper surface of the insulating substrate.

According to an embodiment of the invention, the patterned conductive layer is embedded in the upper surface of the insulating substrate, and a surface of the patterned conductive layer and the upper surface of the insulating substrate are coplanar.

In summary, in the electronic device according to embodiments of the invention, the chip and the patterned conductive layer are disposed on the insulating substrate. Moreover, the chip is electrically connected to the to the external circuit via the patterned conductive layer, so heat generated by the chip is transferred to external surroundings via the patterned conductive layer and the insulating substrate, thereby achieving the electro-thermal separation effect. Accordingly, the electronic device has greater flexibility in circuit design, and heat generated by the chip can be directly transferred downwards for direct heat dissipation via the insulating substrate. Therefore, the electronic device has a preferable heat dissipation effect capable of enhancing the overall product performance.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
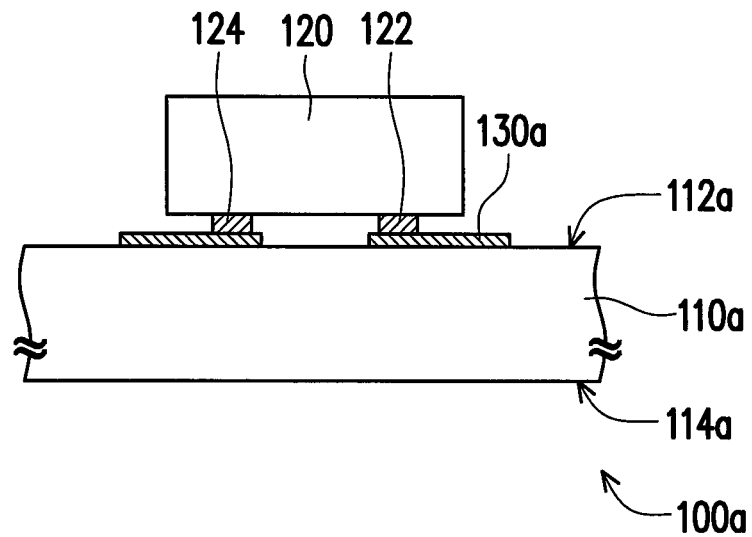
FIG. 1A is a schematic cross-sectional view of an electronic device according to an embodiment of the invention.

FIG. 1A is a schematic cross-sectional view of an electronic device according to an embodiment of the invention. Referring to FIG. 1A, in the present embodiment, an electronic device 100a includes an insulating substrate 110a, a chip 120, and a patterned conductive layer 130a. Specifically, the insulating substrate 110a has an upper surface 112a and a lower surface 114a opposite to each other. The chip 120 is disposed above the upper surface 112a of the insulating substrate 110a, and the chip 120 has a plurality of conductive contacts 122 and 124. The patterned conductive layer 130a is disposed between the upper surface 112a of the insulating substrate 110a and the chip 120, in which the patterned conductive layer 130a is conductive on the upper surface 112a of the insulating substrate 110a, and the conductive contacts 122 and 124 are electrically connected to the patterned conductive layer 130a. Particularly, the chip 120 is adapted to electrically connect to an external circuit (not drawn) via the patterned conductive layer 130a, and heat generated by the chip 120 is transferred to external surroundings via the patterned conductive layer 130a and the insulating substrate 110a.

It should be noted that, the chip 120 is, for example, an electronic chip or an optoelectronic chip, although the invention is not limited thereto. For example, the electronic chip may be an integrated circuit chip such as a single graphic chip, a memory chip, a communication chip, or a multi-chip combination. The optoelectronic chip is, for example, an LED chip or a laser LED chip. Here, the chip 120 is taken as an electronic chip for description purposes.

Since the chip 120 of the electronic device 100a is electrically connected to an external circuit (not drawn) via the patterned conductive layer 130a, and heat generated by the chip 120 is transferred to external surroundings via the patterned conductive layer 130a and the insulating substrate 110a, an electro-thermal separation effect is achieved. Accordingly, the electronic device 100a of the present embodiment has greater flexibility in circuit design, and heat generated by the chip 120 can be directly transferred downwards for heat dissipation directly through the insulating substrate 110a. Therefore, the electronic device 100a has a preferable heat dissipation effect capable of enhancing the overall product performance.

It should be noted that, the embodiments described hereafter employ the reference labels and a portion of the technical content in the afore-described embodiment, and same or similar reference labels are used to represent the same or the like elements. Moreover, description of the same technical content is omitted. The omitted portion of the description can be referred to the afore-described embodiment, and therefore is not repeated herein.

Figure 1B:
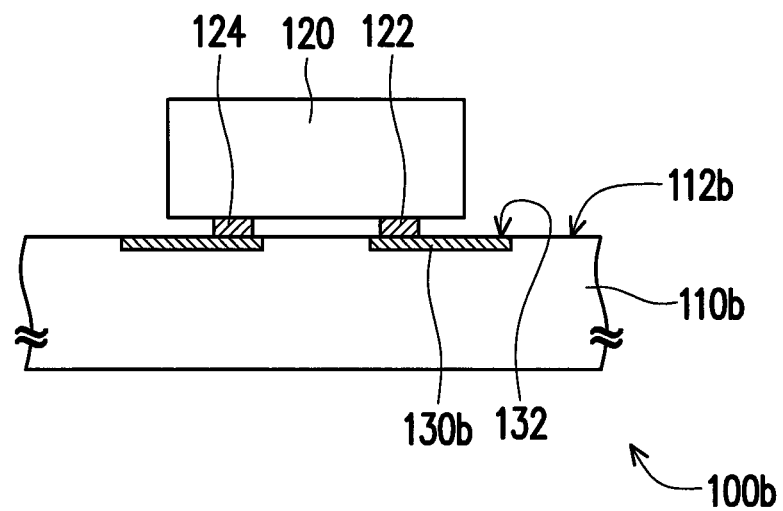
FIG. 1B is a schematic cross-sectional view of an electronic device according to another embodiment of the invention.

FIG. 1B is a schematic cross-sectional view of an electronic device according to another embodiment of the invention. Referring to FIG. 1B, an electronic device 100b of the present embodiment is similar to the electronic device 100a depicted in FIG. 1A. A difference between the two lies in that, a patterned conductive layer 130b of the electronic device 100b is embedded in an upper surface 112b of an insulating substrate 110b. Moreover, a surface 132 of the patterned conductive layer 130b and the upper surface 112b of the insulating substrate 110b are substantially coplanar. Therefore, the electronic device 100b can have a thinner thickness, thereby satisfying current demands for slimness and lightweight.

Figure 1C:
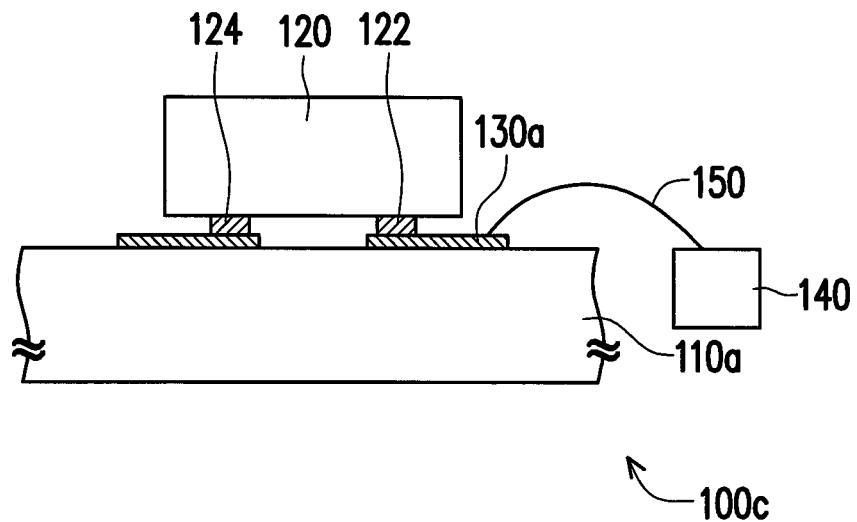
FIG. 1C is a schematic cross-sectional view of an electronic device according to another embodiment of the invention.

FIG. 1C is a schematic cross-sectional view of an electronic device according to another embodiment of the invention. Referring to FIG. 1C, an electronic device 100c of the present embodiment is similar to the electronic device 100a depicted in FIG. 1A. A difference between the two lies in that, the electronic device 100c further includes at least a conductive connecting structure 150 (only one is schematically illustrated in FIG. 1C) connected between the patterned conductive layer 130a and an external circuit 140. Particularly, the chip 120 is electrically connected to the external circuit 140 via the patterned conductive layer 130a and the conductive connecting structure 150. The external circuit 140 is a lead frame, a circuit substrate, or a printed circuit board, for example. The conductive connecting structure 150 is a wire bond, electric wire, or a eutectic structure, although the invention is not limited thereto. Since the electronic device 100c of the present embodiment may electrically connect to the external circuit 140 via the conductive connecting structure 150, the application range of the electronic device 100c can be effectively broadened.

Figure 1D:
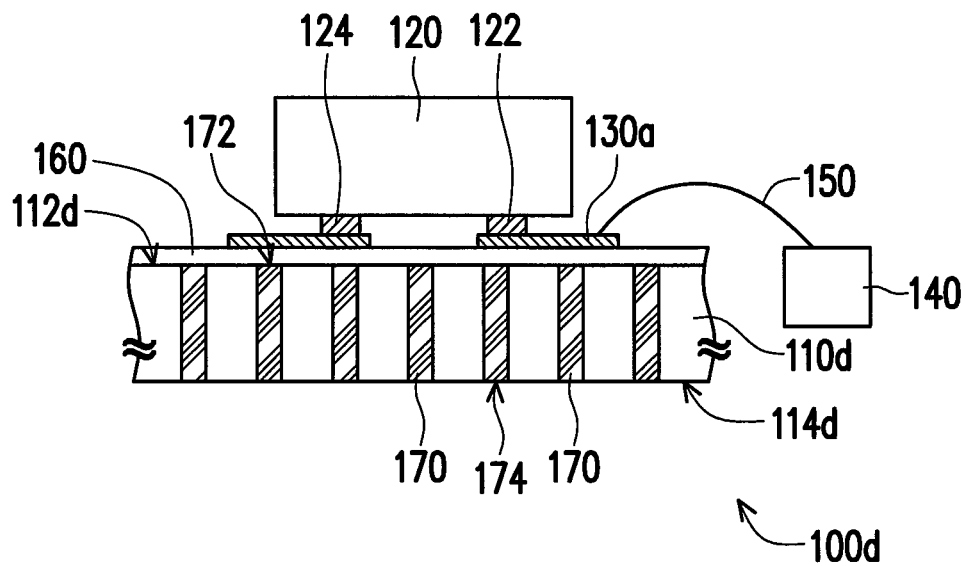
FIG. 1D is a schematic cross-sectional view of an electronic device according to another embodiment of the invention.

FIG. 1D is a schematic cross-sectional view of an electronic device according to another embodiment of the invention. Referring to FIG. 1D, an electronic device 100d of the present embodiment is similar to the electronic device 100c depicted in FIG. 1C. A difference between the two lies in that, in order to enhance the heat dissipation effect, the electronic device 100d further includes an insulating layer 160 and a plurality of heat dissipation channels 170. Specifically, the insulating layer 160 is disposed between the patterned conductive layer 130a and the insulating substrate 100d. The heat dissipation channels 170 pass through an upper surface 112d and a lower surface 114d of the insulating substrate 110d. A top surface 172 of each of the heat dissipation channels 170 is connected to the insulating layer 160. Moreover, a bottom surface 174 of each of the heat dissipation channels 170 and the lower surface 114d of the insulating substrate 110d are substantially coplanar. Accordingly, heat generated by the chip 120 can be transferred downwards via the patterned conductive layer 130a and the insulating layer 160 to the insulating substrate 110d and the heat dissipation channels 170 for direct heat dissipation. Therefore, the heat dissipation effect of the electronic device 100d can be effectively enhanced.

It should be noted that, in the present embodiment, the heat dissipation channels 170 may be air channels, such as channels with no fillings. Alternatively, the heat dissipation channels 170 may be channels filled by a metal (e.g. gold, aluminum, or copper), a metal alloy, or other suitable heat conductive materials. Accordingly, the heat dissipation channels 170 depicted in FIG. 1D uses metal-filled channels as an illustrative example.

Figure 1E:
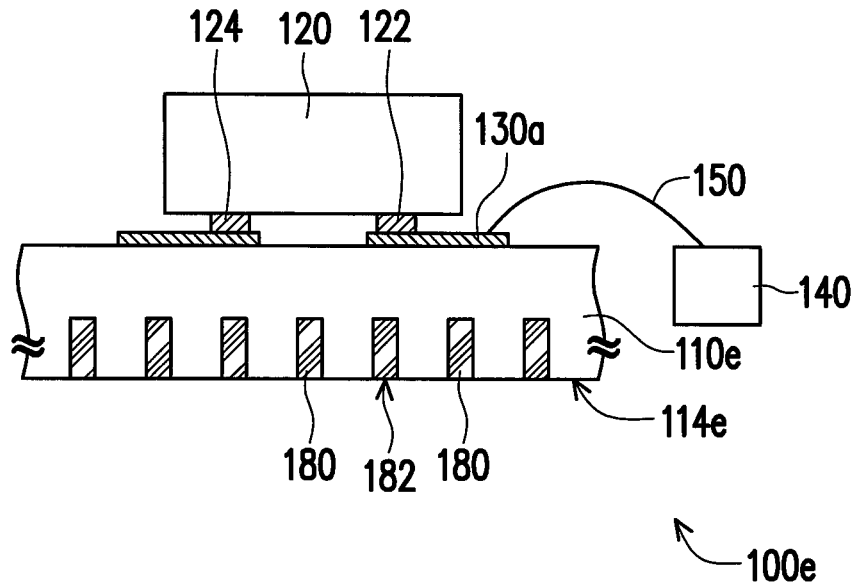
FIG. 1E is a schematic cross-sectional view of an electronic device according to another embodiment of the invention.

FIG. 1E is a schematic cross-sectional view of an electronic device according to another embodiment of the invention. Referring to FIG. 1E, an electronic device 100e of the present embodiment is similar to the electronic device 100c depicted in FIG. 1C. A difference between the two lies in that, in order to enhance the heat dissipation effect, the electronic device 100e further includes at least a heat dissipation device 180 (a plurality of heat dissipation devices 180 are schematically illustrated in FIG. 1E) embedded in a lower surface 114e of an insulating substrate 110e. Moreover, a preferable heat dissipation effect results when a surface 182 of each of the heat dissipation devices 180 and the lower surface 114e of the insulating substrate 110e are substantially coplanar. The heat dissipation devices 180 are, for example, heat dissipation rods or blocks formed by a metal (e.g. gold, aluminum, or copper), a metal alloy, or other appropriate heat conductive materials. Accordingly, heat generated by the chip 120 can be directly transferred downwards via the patterned conductive layer 130a to the insulating substrate 110e and the heat dissipation devices 180 for direct heat dissipation. Therefore, the heat dissipation effect of the electronic device 100e can be effectively enhanced.

Figure 1F:
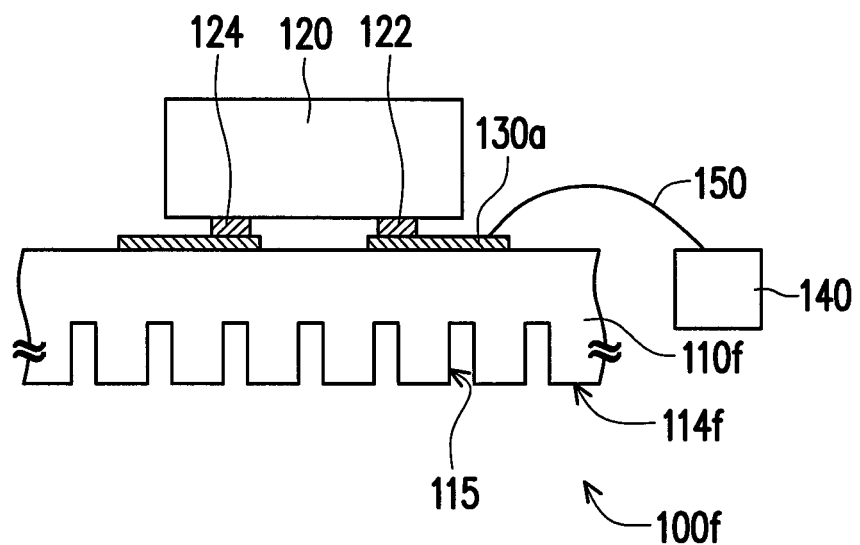
FIG. 1F is a schematic cross-sectional view of an electronic device according to another embodiment of the invention.

FIG. 1F is a schematic cross-sectional view of an electronic device according to another embodiment of the invention. Referring to FIG. 1F, an electronic device 100f of the present embodiment is similar to the electronic device 100c depicted in FIG. 1C. A difference between the two lies in that, in order to enhance the heat dissipation effect, an insulating substrate 110f of the electronic device 100f further includes at least a blind hole 115 (a plurality of blind holes 115 are schematically illustrated in FIG. 1F) disposed on a lower surface 114f of the insulating substrate 110f. Accordingly, heat generated by the chip 120 can be directly transferred downwards via the patterned conductive layer 130a to the insulating substrate 110f for direct heat dissipation. Moreover, the design of the blind holes 115 can increase air flow, thereby enhancing the heat dissipation effect of the electronic device 100f.

Figure 1G:
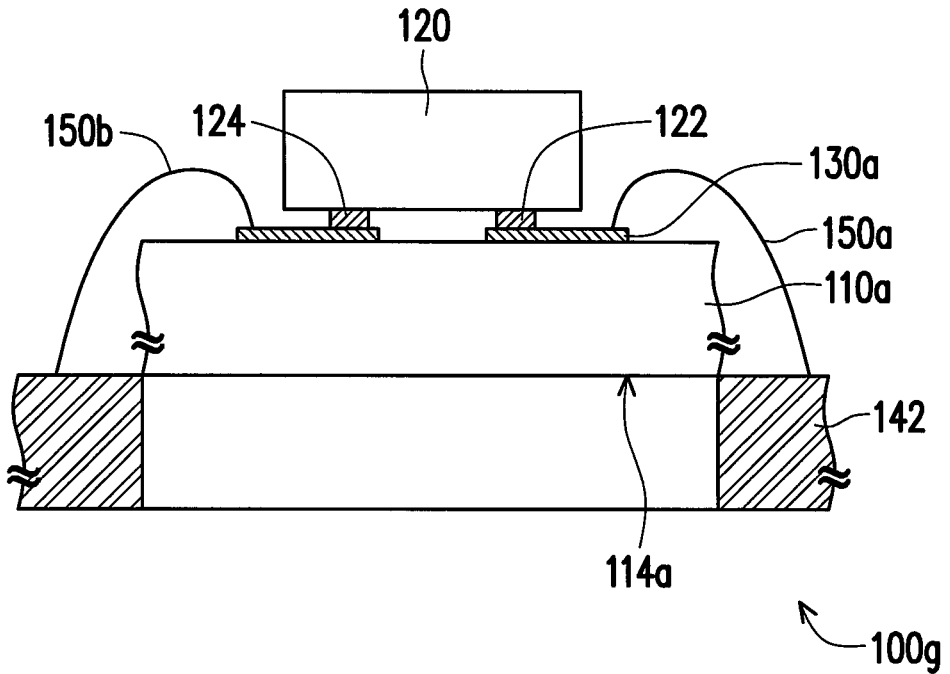
FIG. 1G is a schematic cross-sectional view of an electronic device according to another embodiment of the invention.

FIG. 1G is a schematic cross-sectional view of an electronic device according to another embodiment of the invention. Referring to FIG. 1G, an electronic device 100g of the present embodiment is similar to the electronic device 100c depicted in FIG. 1C. A difference between the two lies in that, an external circuit 142 of the electronic device 100g uses a lead frame as an illustrative example. Moreover, the chip 120 may electrically connect to the external circuit 142 via the patterned conductive layer 130a, the conductive connecting structures 150a and 150b in sequence, so as to effectively expand the application range of the electronic device 100g.

Figure 1H:
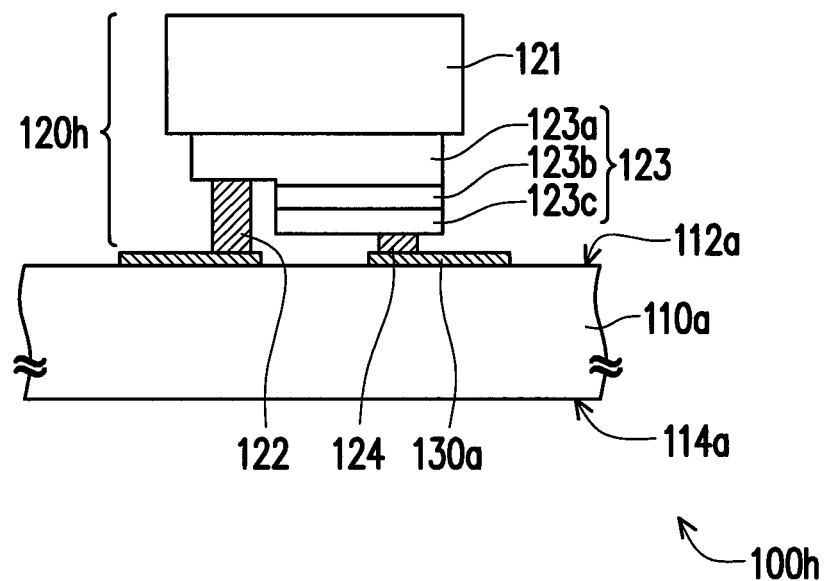
FIG. 1H is a schematic cross-sectional view of an electronic device according to another embodiment of the invention.

FIG. 1H is a schematic cross-sectional view of an electronic device according to another embodiment of the invention. Referring to FIG. 1H, an electronic device 100h of the present embodiment is similar to the electronic device 100a depicted in FIG. 1A. A difference between the two lies in that, a chip 120h of the electronic device 100h uses a flip chip LED chip as an illustrative example. Specifically, the chip 120h of the present embodiment includes a chip substrate 121, a semiconductor layer 123, and conductive contacts 122 and 124. The semiconductor layer 123 includes an N-type doped layer 123a, a light emitting layer 123b, and a P-type doped layer 123c. The light emitting layer 123b is located between the N-type doped layer 123a and the P-type doped layer 123c, and the conductive contacts 122 and 124 are respectively electrically connected to the N-type doped layer 123a and the P-type doped layer 123c.

In order for the insulating substrate 110a to contain the heat generated by the chip 120h during the light emitting process, and to mitigate the issue of reduced light emitting efficiency due to heat accumulation in the chip 120h, a specific heat of the insulating substrate 110a and the chip substrate 121 needs to be higher than 650 J/Kg-K. Alternatively, by having the coefficient of thermal conductivity of the insulating substrate be greater than 10 W/m-K, heat accumulated in the chip 120h can be rapidly transferred outwards. Moreover, in order to increase the light extraction efficiency, it is necessary to prevent absorption of the light emitted from the light emitting layer 123b by the substrate. Therefore, the insulating substrate 110a and the chip substrate 121 are transparent insulating substrates. For example, the insulating substrate 110a and the chip substrate 121 may be glass substrates, gallium arsenide substrates, gallium nitride substrates, aluminum nitride substrates, sapphire substrates, silicon carbide substrates, etc. In order to achieve characteristics of transparency and high capacitance, preferably the insulating substrate 110a and the chip substrate 121 are sapphire substrates. Particularly, a thickness of the insulating substrate 110a of the present embodiment is lower than or equal to a thickness of the chip substrate 121. Preferably, the thickness of the insulating substrate 110a is 0.6 to 1 times the thickness of the chip substrate 121. Moreover, a specific surface area of the insulating substrate 110a is greater than a specific surface area of the chip substrate 121. Preferably, the specific surface area of the insulating substrate 110a is greater than 1.1 times the specific surface area of the chip substrate 121. Accordingly, by having an insulating substrate 110a that is preferably thinner and has a large specific surface area, heat accumulated in the chip 120h can be rapidly transferred outwards.

In the present embodiment, the semiconductor layer 123 of the electronic device 100h is electrically connected to the external circuit (not drawn) via the conductive contacts 122 and 124 and the patterned conductive layer 130a. Moreover, heat generated by the semiconductor layer 123 is transferred to external surroundings via the patterned conductive layer 130a and the insulating substrate 110a, so as to achieve the electro-thermal separation effect. Accordingly, the electronic device 100h of the present embodiment has greater flexibility in circuit design, and heat generated by the chip 123 can be directly transferred outwards for direct heat dissipation through the insulating substrate 110a. Therefore, the electronic device 100h has a preferable heat dissipation effect capable of enhancing the overall product performance.

Moreover, in other embodiments not illustrated, persons having ordinary skill in the art may select to adopt the aforedescribed patterned conductive layer 130b embedded in the insulating substrate 110b, the conductive connecting structures 150, 150a, and 150b, the insulating layer 160 and the heat dissipation channels 170, and the heat dissipation device 180 and the insulating substrate 110f having the blind holes 115 by referring to the description provided for the previous embodiments. By selecting the foregoing components according to a practical requirement, a needed technical effect can be achieved.

Figure 1I:
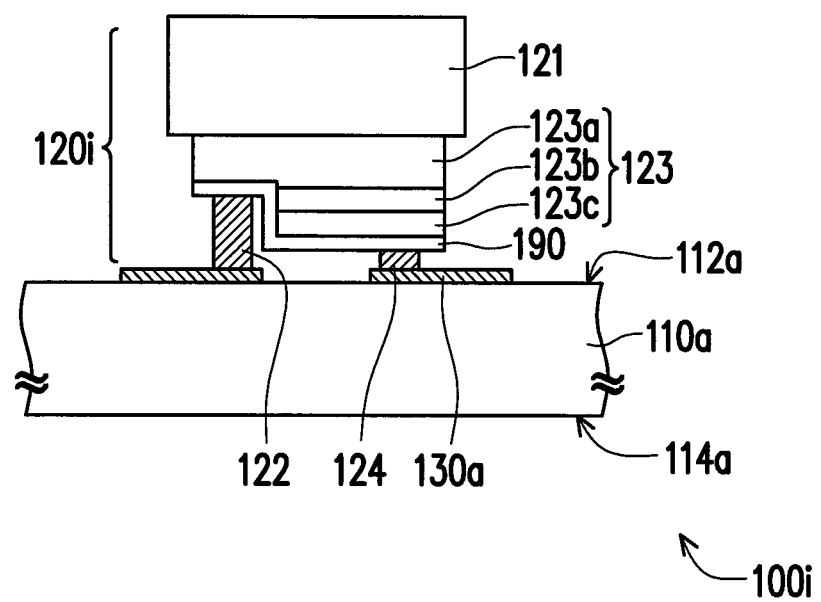
FIG. 1I is a schematic cross-sectional view of an electronic device according to another embodiment of the invention.

FIG. 1I is a schematic cross-sectional view of an electronic device according to another embodiment of the invention. Referring to FIG. 1I, an electronic device 100i of the present embodiment is similar to the electronic device 100h depicted in FIG. 1H. A difference between the two lies in that, a chip 120*i* of the electronic device 100*i* of the present embodiment further includes a reflective layer 190. The reflective layer 190 is disposed between the semiconductor layer 123 of the chip 120*i* and the conductive contacts 122 and 124. Moreover, the reflective layer 190 is adapted to increase the light emitting efficiency of the chip 120*i*, so the electronic device 100*i* has a preferable luminance effect.

In view of the foregoing, in the electronic device according to embodiments of the invention, the chip and the patterned conductive layer are disposed on the insulating substrate. Moreover, the chip is electrically connected to the to the external circuit via the patterned conductive layer, so heat generated by the chip is transferred to external surroundings via the patterned conductive layer and the insulating substrate, thereby achieving the electro-thermal separation effect. Accordingly, the electronic device has greater flexibility in circuit design, and heat generated by the chip can be directly transferred downwards for direct heat dissipation via the insulating substrate. Therefore, the electronic device has a preferable heat dissipation effect capable of enhancing the overall product performance.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electronic device, comprising:
an insulating substrate having an upper surface and a lower surface opposite to each other;
a chip disposed above the upper surface of the insulating substrate, wherein the chip comprises a chip substrate, a semiconductor layer, and a plurality of conductive contacts, the semiconductor layer is located between the chip substrate and the conductive contacts, a thickness of the insulating substrate is 0.6 to 1 times a thickness of the chip substrate, and a specific surface area of the insulating substrate is greater than 1.1 times a specific surface area of the chip substrate; and
a patterned conductive layer disposed between the upper surface of the insulating substrate and the chip, wherein the conductive contacts are directly connected to the patterned conductive layer, the chip is electrically connected to an external circuit via the patterned conductive layer, and heat generated by the chip is transferred to external surroundings via the patterned conductive layer and the insulating substrate.

2. The electronic device as claimed in claim 1, wherein a specific heat of the insulating substrate is higher than 650 J/Kg-K.

3. The electronic device as claimed in claim 1, wherein a coefficient of thermal conductivity of the insulating substrate is greater than 10 W/m-K.

4. The electronic device as claimed in claim 1, wherein a material of the insulating substrate and a material of the chip substrate are the same.

5. The electronic device as claimed in claim 1, wherein the chip further comprises a reflective layer disposed between the semiconductor layer and the conductive contacts, and the reflective layer directly contacts to at least one of the conductive contacts.

6. The electronic device as claimed in claim 1, further comprising at least conductive connecting structure connected between the patterned conductive layer and the external circuit, the chip electrically connected to the external circuit via the patterned conductive layer and the conductive connecting structures.

7. The electronic device as claimed in claim 6, wherein the external circuit comprises a lead frame, a circuit substrate, or a printed circuit board.

8. The electronic device as claimed in claim 1, further comprising a heat dissipation device embedded in the lower surface of the insulating substrate.

9. The electronic device as claimed in claim 1, further comprising an insulating layer and a plurality of heat dissipation channels, wherein the insulating layer is disposed between the patterned conductive layer and the insulating substrate, the heat dissipation channels pass through the upper surface and the lower surface of the insulating substrate, a top surface of each of the heat dissipation channels is connected to the insulating layer, and a bottom surface of each of the heat dissipation channels and the lower surface of the insulating substrate are coplanar.

10. The electronic device as claimed in claim 1, wherein the insulating substrate further comprises at least a blind hole disposed on the lower surface.

11. The electronic device as claimed in claim 1, wherein the patterned conductive layer is located on the upper surface of the insulating substrate.

12. The electronic device as claimed in claim 1, wherein the patterned conductive layer is embedded in the upper surface of the insulating substrate, and a surface of the patterned conductive layer and the upper surface of the insulating substrate are coplanar.

* * * * *